United States Patent [19]
Price, Jr.

[11] Patent Number: 5,635,863
[45] Date of Patent: Jun. 3, 1997

[54] PROGRAMMABLE PHASE COMPARATOR

[75] Inventor: John J. Price, Jr., Edina, Minn.

[73] Assignee: VTC, Inc., Bloomington, Minn.

[21] Appl. No.: 451,043

[22] Filed: May 25, 1995

[51] Int. Cl.$^6$ .............. G01R 25/04; H03K 5/22
[52] U.S. Cl. .............. 327/3; 327/175; 327/247; 327/355
[58] Field of Search .............. 327/2, 7, 233, 327/236, 237, 238, 246, 356, 357, 359, 116, 119, 120, 563, 560, 362, 3, 175, 247, 355, 12; 330/9

[56] References Cited

U.S. PATENT DOCUMENTS

| | | | |
|---|---|---|---|
| 4,019,118 | 4/1977 | Harwood | 327/119 |
| 4,870,303 | 9/1989 | McGinn | 307/511 |
| 5,034,706 | 7/1991 | Betti et al. | 331/117 R |
| 5,122,687 | 6/1992 | Schmidt | 327/359 |
| 5,136,253 | 8/1992 | Ueno | 328/133 |
| 5,151,624 | 9/1992 | Stegherr et al. | 327/356 |
| 5,182,476 | 1/1993 | Hanna et al. | 327/362 |
| 5,182,477 | 1/1993 | Yamasaki et al. | 330/260 |
| 5,182,478 | 1/1993 | Nomura | 307/521 |
| 5,196,742 | 3/1993 | McDonald | 327/65 |
| 5,225,790 | 7/1993 | Noguchi et al. | 330/260 |
| 5,307,020 | 4/1994 | Marcuard | 328/133 |
| 5,317,216 | 5/1994 | Hosoya et al. | 307/521 |
| 5,343,097 | 8/1994 | Takeuchi | 327/3 |
| 5,418,494 | 5/1995 | Betti et al. | 330/254 |
| 5,442,311 | 8/1995 | Trafton | 327/346 |
| 5,448,772 | 9/1995 | Grandfield | 327/357 |

OTHER PUBLICATIONS

Gray, Paul R., and Robert G. Meyer, *Analysis and Design of Analog Integrated Circuits*, John Wiley & Sons, pp. 563–575 (1977).

*Primary Examiner*—Timothy P. Callahan
*Assistant Examiner*—Terry L. Englund
*Attorney, Agent, or Firm*—Kinney & Lange, P.A.

[57] ABSTRACT

A programmable phase comparator comprises a switch circuit operable in response to first and second signals to provide an output signal representative of the phase relationship of the first and second signals. A reference signal is applied to the switch circuit to offset the output signal. A phase adjustment adjusts the phase relationship of the first and second signals so that the offset output signal is representative of a null condition. The switch circuit preferably is a Gilbert multiplier having a current source, an impedance means, and a transistor circuit connected between the current source and the impedance means. The transistor circuit has first and second inputs for receiving the first and second signals. The reference signal is input between the transistor circuit and the impedance means and is connected to an output. The output provides the output signal having a value based on the reference signal and the phase relationship of the first and second signals.

20 Claims, 4 Drawing Sheets

PROGRAMMABLE PHASE COMPARATOR

BACKGROUND OF THE INVENTION

This invention relates to a programmable phase comparator, and particularly to a programmable phase comparator for filter cutoff tuning.

In the data storage art employing rotatable memories, such as magnetic and optical disc drives, it is common to employ a zone density recording technique to maintain bit density substantially uniform across the radius of the disc. More particularly, for maximum recording density, it is desired that each bit of information occupy substantially an equal amount of space on the disc surface. To accomplish this, it is common to record information at higher frequencies at the outer tracks than at the inner tracks. Typically, a frequency synthesizer establishes the recording frequency. When recovering data recorded at various frequencies, the data recovery circuits are operated at comparable data recovery frequencies. Typically, the data recovery circuits include a filter having a cutoff frequency that tracks the recording frequency. For example, the filter cutoff frequency may be established by the frequency synthesizer. However, for a variety of reasons, it is desirable to alter the filter cutoff frequency from that established by the frequency synthesizer.

One common filter is a master-slave filter in which a master filter produces a 90° phase shift when its cutoff frequency matches a reference frequency, such as the frequency of the frequency synthesizer. A phase comparator is employed to produce a null condition at the 90° phase shift. When the correct phase shift is achieved, the slave filter, which is the principal filter for the data recovery circuits, will have a cutoff frequency related to the reference frequency.

One problem in zone density recording is that an entire zone of plural tracks are recorded at a fixed frequency, with recording frequencies varying between zones. However, with the desire for higher recording densities, the zones have encompassed fewer tracks, thereby proliferating the number of zones. As the number of zones increases, a greater amount of memory space is required to retain the look-up table storing frequency data. It is desirable to store a region reference frequency in the look-up table and provide offsets to that frequency to meet the demand for the great number of zone reference frequencies. However, prior techniques to vary the slave filter cutoff frequency around the frequencies set by the reference frequency of the master filter have met with only limited success.

SUMMARY OF THE INVENTION

The present invention is directed to a programmable phase comparator employing an offset to achieve a null output at other than a 90° phase shift. The programmable phase comparator is useful in a data recovery circuit for a disc drive where a track identification signal is obtained, either from a header on the data track or from a separate servo disc. The track identification is correlated, such as through a look-up table, to a recording frequency. A digital-to-analog converter (DAC) responds to the frequency data to drive a current source which provides the offset signal to the programmable phase comparator.

In one aspect of the invention, an offset circuit comprises a switch circuit having a current source, impedance means, and a transistor circuit connected between the current source and the impedance means. The transistor circuit has first and second inputs for receiving respective first and second signals having a phase relationship. A reference input is connected between the transistor circuit and the impedance means to receive a reference input signal having a signal value. An output is connected to the reference input to provide an output signal having a value based on the signal value of the reference signal and the phase relationship of the first and second signals. In a preferred form of this aspect of the invention, the switch circuit is a Gilbert multiplier.

In a second aspect of the invention, first and second signals having a phase relationship operate a switch to produce an output signal representative of the phase relationship. A reference signal is applied to the switch to offset the output signal. A phase adjustment adjusts the phase relationship of the first and second signals so that the offset output signal is representative of a null condition.

In one form of the invention, the switch circuit comprises a current source, impedance means, and a transistor circuit connected between the current source and the impedance means, preferably arranged as a Gilbert multiplier. The transistor circuit has first and second inputs for receiving the first and second signals. The reference signal is applied between the transistor circuit and the impedance means. An output is connected to the reference signal input to provide an output signal having a value based on the signal value of the reference signal and the phase relationship of the first and second signals, the phase comparator being responsive to the output signal to adjust the phase relationship of the first and second signals so that the output signal indicates a null.

Another aspect of the present invention resides in a process for producing an output signal representative of a null condition in which a switch circuit is responsive to first and second signals to provide an output signal representative of the phase relationship of the first and second signals. The output signal provided by the switch circuit is offset, and the phase relationship of the first and second signals is adjusted so that the offset output signal is representative of a null condition.

DETAILED DESCRIPTION OF THE PREFERRED EMBODIMENTS

Figure 1:
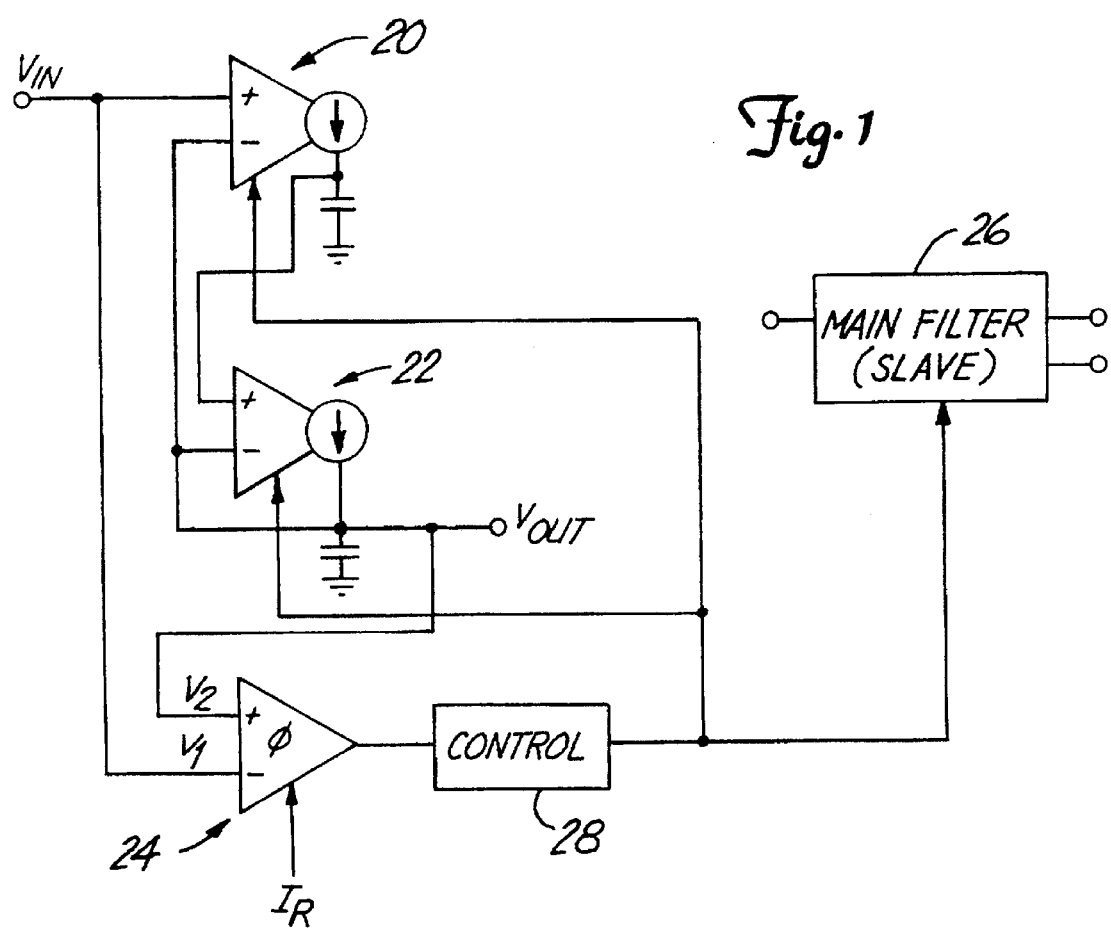
FIG. 1 is a block diagram of a master-slave filter employing the programmable phase comparator in accordance with the presently preferred embodiment of the present invention.

FIG. 1 is a block diagram of a master-slave filter employing the programmable phase comparator in accordance with the presently preferred embodiment of the present invention. The circuit comprises a master biquad consisting of a pair of differential amplifiers 20 and 22 and a phase comparator 24, shown in greater detail in FIG. 2. An input signal $V_{IN}$ is applied to the non-inverting side of amplifier 20 and to one side of phase comparator 24. As will be more fully understood in respect to FIG. 2, the $V_{IN}$ signal (or $V_1$ in FIG. 2) is actually a pair of complimentary signals, one being the inverse of the other. The output of amplifier 20 is provided to the non-inverting input of amplifier 22 whose output is provided to the inverting input of both amplifiers 20 and 22, as well as to phase comparator 24 as signal $V_2$. Again, as will be more fully understood in connection with FIG. 2, signal $V_2$ comprises a pair of complementary signals. The output of phase comparator 24 is provided to control circuit 28 which provides a control signal to the amplifiers 20 and 22 and to filter 26.

The biquad comprising differential amplifiers 20 and 22 operates to shift the phase between signals $V_2$ and $V_1$ based on the DC value of the control signal from control circuit 28. In the present invention, and as will be more fully understood in connection with the description of FIG. 2, a null condition is achieved when the output of phase comparator 24 is zero volts. In the absence of an offset current, phase comparator 24 operates to provide a nominal control signal when the input $V_1$ and $V_2$ signals are exactly 90° out of phase. Control circuit 28 is responsive to the output of the phase comparator to provide a control signal to amplifiers 20 and 22 to shift the phase of $V_2$ with respect to $V_1$ until a null is reached.

The present invention is directed to a modification of phase comparator 24 by which an offset current $I_R$ is applied to phase comparator 24 to shift the null condition of the phase comparator. Shifting the null condition changes the phase comparator's response to signals $V_1$ and $V_2$ such that the comparator produces a null output at a phase difference set by reference current $I_R$. Hence, the phase comparator is programmable in accordance with the value of signal $I_R$.

Figure 2:
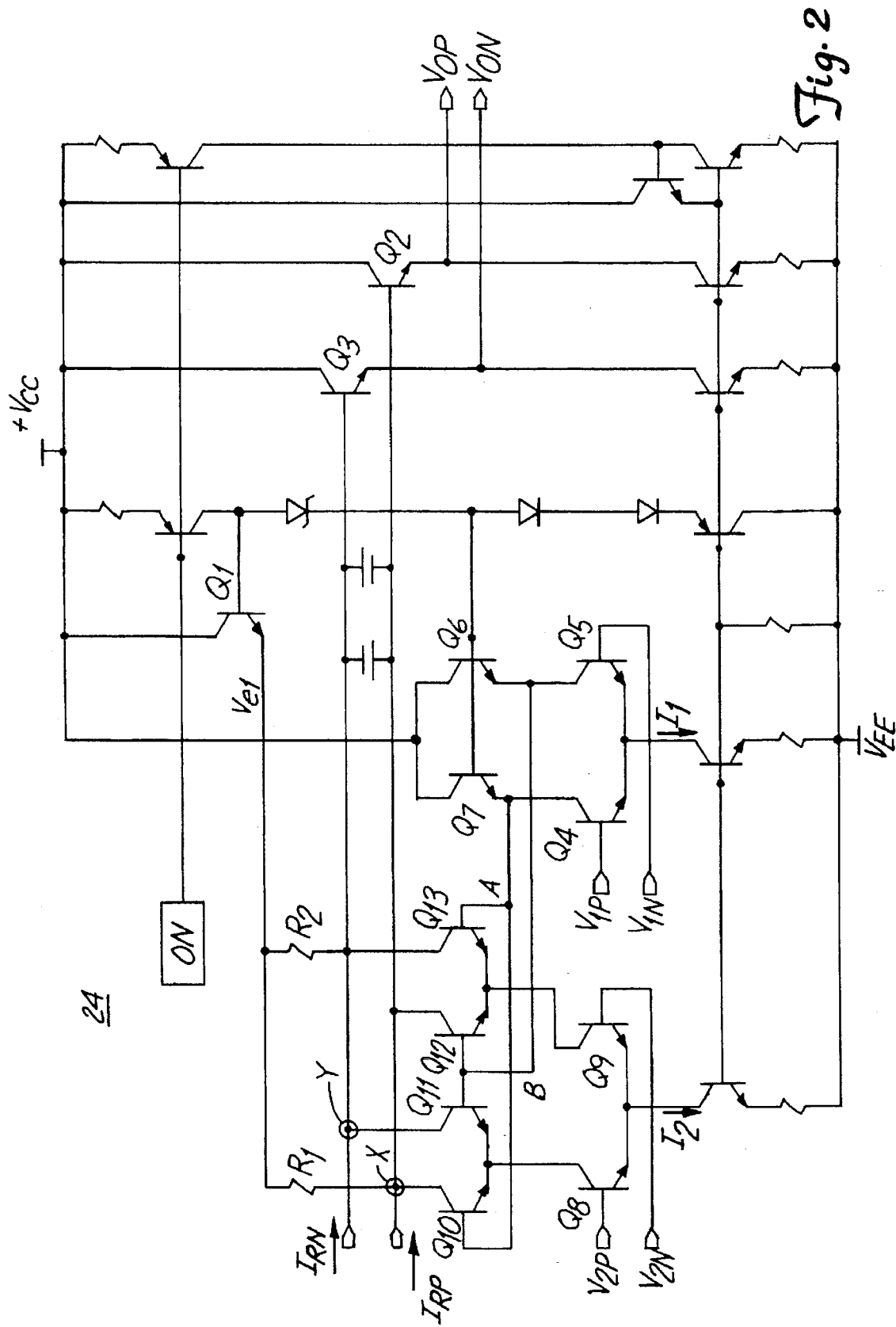
FIG. 2 is a circuit diagram of a programmable phase comparator for use in the filter shown in FIG. 1.

FIG. 2 illustrates the programmable phase comparator with offset control in accordance with the presently preferred embodiment of the present invention.

A reference current signal $I_R$ is input to the circuit at $I_{RP}$ and $I_{RN}$. This reference signal is a current signal provided by a current source (not shown) controlled by the DAC (not shown). $I_{RP}$, represents the reference signal and $I_{RN}$ is the complement of $I_{RP}$. As will become apparent below, the reference signal is a current signal whose value controls the amount of phase shift between $V_1$ and $V_2$ required to achieve a null condition. Junctions X and Y are connected to respective inputs to receive respective reference signals $I_{RP}$ and $I_{RN}$. Junctions X and Y are also connected through NPN transistor $Q_1$ (operated by power on) and respective resistors $R_1$ and $R_2$ to a positive source voltage $V_{CC}$. Junctions X and Y are connected to the bases of NPN transistor amplifiers $Q_2$ and $Q_3$, respectively. Transistors $Q_2$ and $Q_3$ provide outputs at $V_{OP}$ and $V_{ON}$, respectively. The collectors of transistors $Q_2$ and $Q_3$ are connected to $V_{CC}$, and the emitters of transistors $Q_2$ and $Q_3$ are connected through respective transistor/resistor combinations to negative voltage source $V_{EE}$.

First and second switching circuits are respectively operated by input signals $V_1$ and $V_2$ in the form of $V_{1P}$ and $V_{1N}$, and $V_{2P}$ and $V_{2N}$; $V_{1N}$ and $V_2N$ being the inverse of uninverted signals $V_{1P}$ and $V_{2P}$, respectively. The first switching circuit comprises NPN transistors $Q_4$, $Q_5$, $Q_6$ and $Q_7$. The bases of transistors $Q_4$ and $Q_5$ are connected to respective signals $V_{1P}$ and $V_{1N}$. The collectors of transistors $Q_4$ and $Q_5$ are connected respectively to the emitters of transistors $Q_7$ and $Q_8$, whose collectors are connected to $V_{CC}$. The emitters of transistors $Q_4$ and $Q_5$ are connected together through a transistor/resistor circuit to $V_{EE}$.

The second switching circuit is a Gilbert multiplier including NPN transistors $Q_8$ and $Q_9$ whose bases are connected respectively to the $V_{2P}$ and $V_{2N}$ signals and whose emitters are connected to $V_{EE}$ through a transistor/ resistor combination. The collector of transistor $Q_8$ is connected to the emitters of NPN transistors $Q_{10}$ and $Q_{11}$ and the collector of transistor $Q_9$ is connected to the emitters of NPN transistors $Q_{12}$ and $Q_{13}$. The bases of transistors $Q_{10}$ and $Q_{13}$ are connected to the emitter of transistor of $Q_7$ and the bases of transistors $Q_{11}$ and $Q_{12}$ are connected to the emitter of transistor $Q_6$. The collectors of transistors $Q_{10}$ and $Q_{12}$ are connected to junction X and the collectors of transistors $Q_{11}$ and $Q_{13}$ are connected to the junction Y.

Figure 3A:
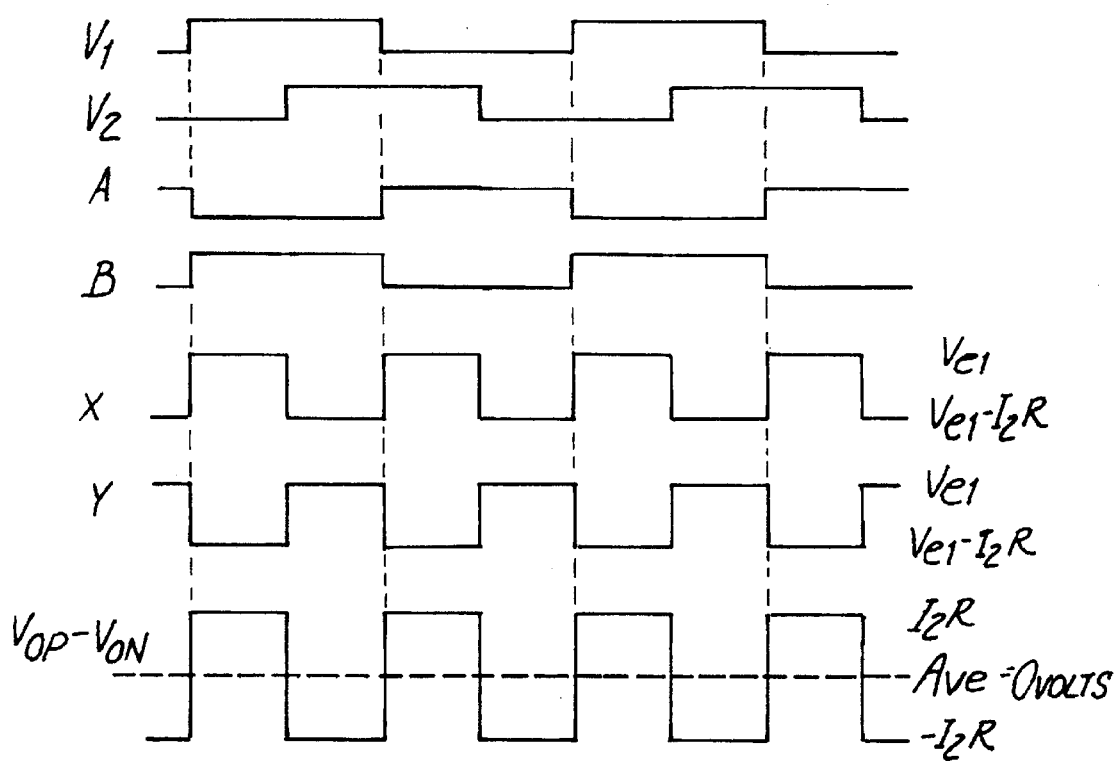
FIGS. 3A and 3B are timing diagrams useful in explaining operation of the circuit illustrated in FIG. 2.

In operation of the circuit of FIG. 2, when input signal $V_{1P}$ is high and $V_{1N}$ is low, transistor $Q_4$ conducts to pull down the signal level at the emitter of transistor $Q_7$ and force up the signal level at the emitter of transistor $Q_6$. As a result, signal A at the base of transistors $Q_{10}$ and $Q_{13}$ goes low and signal B at the base of transistors $Q_{11}$ and $Q_{12}$ goes high. Conversely, when $V_{1P}$ is low and $V_{1N}$ is high, transistor $Q_5$ conducts (current $I_1$) and the signal level at the emitter of transistor $Q_6$ goes low and the signal level at the emitter of transistor $Q_7$ goes high causing signal A to go high and signal B to go low. Thus, as shown in FIG. 3A, signals A and B exactly track input signal $V_1$, with signal A being the inverse of signal $V_{1P}$, and signal B tracking signal $V_{1P}$.

Transistors $Q_8$ and $Q_9$ exactly track input signal $V_2$, with transistor $Q_8$ conducting when $V_{2P}$ is high (and $V_{2N}$ is low) and transistor $Q_9$ conducting when input signal $V_{2N}$ is high (and $V_{2P}$, is low). Thus, transistors $Q_8$ and $Q_9$ provide current paths for the respective transistor pairs, $Q_{10}$, $Q_{11}$, and $Q_{12}$, $Q_{13}$. With transistor $Q_8$ conducting (input signal $V_{2P}$, high and $V_{2N}$ low), transistor $Q_{10}$ conducts when signal A is high, and transistor $Q_{11}$ conducts when signal B is high. With transistor $Q_9$ conducting (input signal $V_{2N}$ high and $V_{2P}$ low), transistor $Q_{12}$ conducts when signal B is high, and transistor $Q_{13}$ conducts when signal A is high.

$V_{EE}$ provides a current $I_2$ to the Gilbert multiplier. When transistors $Q_8$ and $Q_{10}$ are conducting or when transistors $Q_9$ and $Q_{12}$ are conducting, the voltage at junction X due to the supply $V_{EE}$ will be equal to the voltage, $V_{e1}$, at the emitter of transistor $Q_1$, minus the voltage drop across resistor $R_1$ due to current $I_2$ (i.e., $V_{e1}$-$I_2$.$R_1$). When both paths between junction X and $V_{EE}$ are non-conducting (for example when transistors $Q_8$ and $Q_{12}$ are non-conducting or when transistors $Q_9$ and $Q_{10}$ are non-conducting), the voltage at junction X will be $V_{e1}$, assuming no reference current $I_{RP}$. However, the reference current $I_{RP}$, if any, offsets the voltage at junction X by an amount equal to $I_{RP}$.$R_1$. Hence, the voltage at junction X (that is applied to the base of transistor $Q_2$) varies between $V_{e1}$-$I_2$.$R_1$+$I_{RP}$.$R_1$ and $V_{e1}$+$I_{RP}$.$R_1$. Likewise, depending on the state of conduction of transistors $Q_8$, $Q_9$, $Q_{10}$ and $Q_{11}$, the signal at junction Y varies between $V_{e1}$-$I_2$.$R_2$+$I_{RN}$.$R_2$ and $V_{e1}$+$I_{RN}$.$R_2$. It is preferred that the impedance values of resistors $R_1$ and $R_2$ are equal to each other. With $I_{RN}$ as the complement of $I_{RP}$, the signals at junctions X and Y vary between:

$V_{e1}$+$I_R$.R and $V_{e1}$+$I_R$.R -$I_2$.R (at junction X), and $V_{e1}$- $I_R$.R and $V_{e1}$-$I_R$.R -$I_2$.R (at junction Y), where R=$R_1$=$R_2$, and $I_R$=$I_{RP}$=-$I_{RN}$. It will be appreciated that the difference between the signals at X and Y ($V_{OP}$-$V_{ON}$) varies between ($I_2$+$2I_R$)R and (-$I_2$+$2I_R$)R.

If the reference current lit is changed, signals X and Y are offset by an amount based on the reference current to provide a similar offset in output signals $V_{OP}$ and $V_{ON}$. The DC value of the difference between the output signals, $V_{OP}$, -$V_{ON}$, is applied to control circuit 28 (FIG. 1) to alter the phase relation between signals $V_I$ and $V_2$. The phase relation between signals $V_1$ and $V_2$ is shifted until a new null condition results. Hence, the reference current makes it possible to vary the null condition around 90° and thus to vary the cutoff frequencies of the master and slave filters. The effect of the phase shift between input signals $V_1$ and $V_2$ is illustrated in FIGS. 3A and 3B.

FIG. 3A illustrates the condition where the reference current, $I_R$, is zero, so that $V_1$ and $V_2$ must be exactly 90° out of phase to produce a null condition. Since $I_R$ is zero, junction X goes low to $V_{e1}$-$I_2$.R during those periods of time when signals A and $V_{2P}$ are high and when signals B and $V_{2N}$ are high. Junction X goes high to $V_{e1}$ during those periods of time when signals A and $V_{2N}$ are high and when signals B and $V_{2P}$ are high. The voltage at junction Y likewise varies between $V_{e1}$ and $V_{e1}$-$I_2$.R. The result, shown in FIG. 3A, is that the signals at junctions X and Y fluctuate at twice the frequency of $V_1$ and $V_2$ and 180° out of phase with respect to each other. Moreover, in the condition of FIG. 3A, the difference of the output signals $V_{OP}$-$V_{ON}$ peaks at +$I_2$.R and -$I_2$.R to average zero over the duty cycle of the signals, so the outputs $V_{OP}$ and $V_{ON}$ provide a null condition signal with a phase shift between $V_1$ and $V_2$ of 90° for the filter.

Figure 3B:
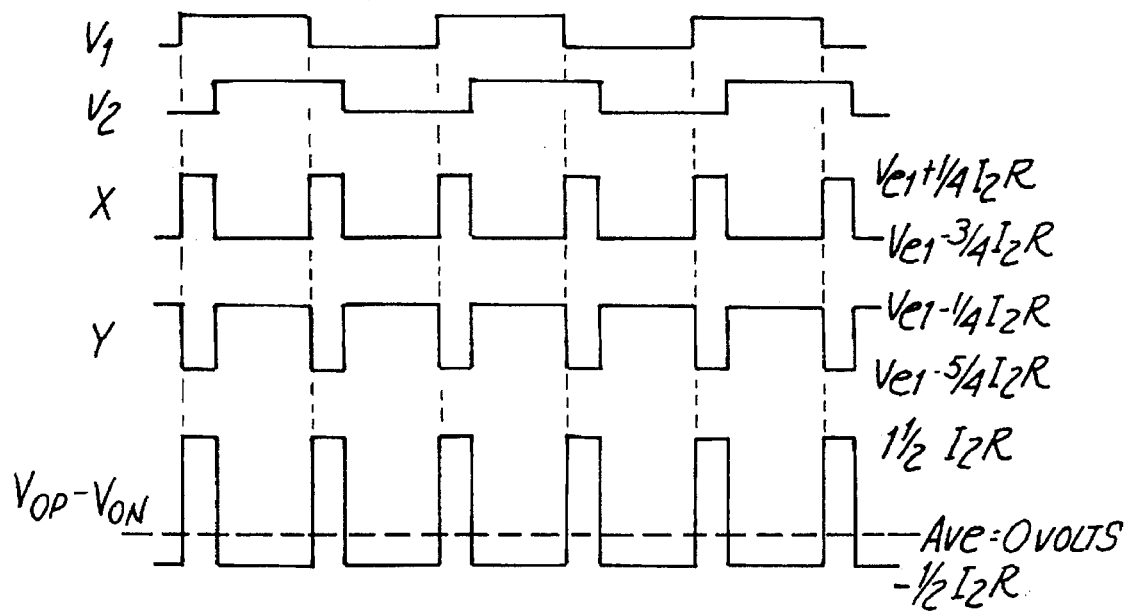

FIG. 3B illustrates the condition where the input reference signal $I_R$ has a value other than zero. More particularly, in FIG. 3B, the reference signal has a value of ¼$I_2$ to cause signal $V_1$ to lead signal $V_2$ by about 45°. As explained above, at null conditions, the signal at junction X varies between a maximum of $V_{e1}$+$I_R$.R (when signal $V_1$ is high and signal $V_{2P}$ is low and when signal $V_1$ is low and signal $V_{2P}$ is high) and a minimum of $V_{e1}$-$I_2$.R+$I_R$.R (when signals $V_1$ and $V_{2P}$ are both high and when signals $V_1$ and $V_{2P}$ are both low). With $I_R$ equal to ¼$I_2$, the signal at junction X varies between $V_{e1}$+¼$I_2$.R and $V_{e1}$-¾$I_2$.R. Likewise, the signal at junction Y varies between $V_{e1}$-¼$I_2$.R and $V_{e1}$-(⅝)$I_2$.R. Hence, the difference of the output signals $V_{OP}$-$V_{ON}$ will have peak values of +1.5 $I_2$.R and -½$I_2$.R and have an average value of zero volts over the duty cycle at the null condition.

Figure 4:
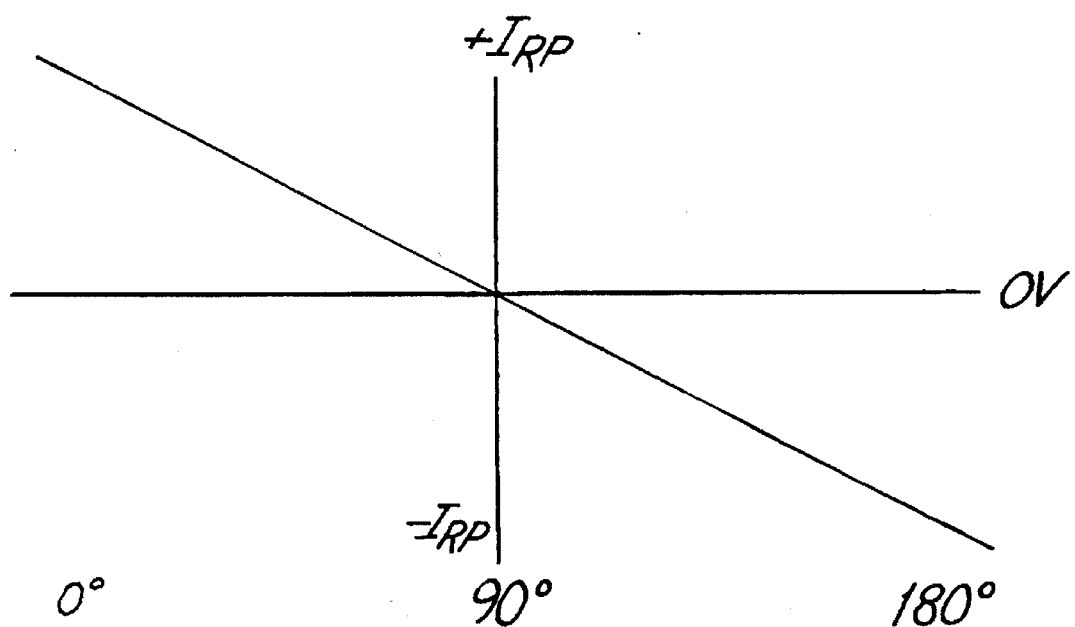
FIG. 4 is a graph illustrating a signal spectrum useful in explaining the results of the circuit of FIG. 2.

FIG. 4 illustrates the relationship of the reference current value to the phase shift between signals $V_1$ and $V_2$ to produce a null condition. Thus, when the reference current $I_{RP}$ is positive, the signals will be less than 90° out of phase to produce a null condition, whereas when the reference current $I_{RP}$ is negative, signals $V_1$ and $V_2$ will be more than 90° out of phase to produce a null condition. When the reference signal current is zero, the crossover of the curve is at 90°, indicating that the input signals $V_1$ and $V_2$ must be at 90° to produce a null.

The present invention thus provides a programmable phase comparator that operates in response to a programmable reference signal to change the phase shift relationship. As a result, the cutoff frequency of filter 26 (FIG. 1) may be altered. While the programmable phase comparator is, in theory, programmable to provide a null condition with phase shifts of up to (but not including) 0° and 180°, linearity of the circuit under ideal conditions limits phase shifts to a maximum of about 45° from the 90° null condition (that is, to produce phase differences between $V_1$ and $V_2$ between about 45° and 135°). Under practical conditions, phase shifts are even less, 30° maximum being typical (to produce phase differences between about 60° and 120°).

Although the present invention has been described with reference to preferred embodiments, workers skilled in the art will recognize that changes may be made in form and detail without departing from the spirit and scope of the invention.

What is claimed is:

1. A programmable phase comparator for comparing first and second substantially-periodic input signals and producing an output signal representing phase differences of the substantially-periodic input signals, the output signal having a null condition representing a first predetermined phase difference, comprising:

switch means responsive to the first and second substantially-periodic input signals for producing the output signal representing phase differences of the first and second substantially-periodic input signals, including the null condition for the first predetermined phase difference; and offset means connected to the switch means and responsive to a reference signal for having the null condition of the output signal instead represent a second predetermined phase difference.

2. The programmable phase comparator of claim 1 wherein the switch means comprises a circuit having a Gilbert multiplier topology.

3. The programmable phase comparator of claim 1 wherein the signal value of the reference signal is selectable independent of values of the first and second substantially-periodic input signals.

4. The programmable phase comparator of claim 1 wherein the value of the reference signal is substantially constant.

5. The programmable phase comparator of claim 1 wherein the first predetermined phase difference is approximately 90°.

6. The programmable phase comparator of claim 1 wherein the first and second substantially-periodic input signals have respective fundamental periods and wherein the output signal is substantially periodic, with a fundamental period different from the respective fundamental periods of the input signals.

7. The programmable phase comparator of claim 1 further including phase adjustment means for changing the phase difference of the first and second substantially-periodic signals toward the second predetermined phase difference.

8. The programmable phase comparator of claim 1 wherein:

the switch means comprises a current source, impedance means, and a transistor circuit connected between the current source and the impedance means, the transistor circuit having first and second inputs for receiving the respective first and second substantially-periodic input signals;

the offset means comprises a reference input connected between the transistor circuit and the impedance means for receiving the reference signal, an output connected to the reference input, the output providing the output signal having a component based on the signal value of the reference signal and representing the phase difference of the first and second substantially-periodic input signals.

9. The programmable phase comparator of claim 8 further including another switch means connected between the second input and the transistor circuit.

10. The programmable phase comparator of claim 8 wherein the switch means comprises a circuit having a Gilbert multiplier topology.

11. The programmable phase comparator of claim 8 wherein:

the reference input signal comprises an uninverted reference signal and an inverted reference signal;

the first input signal comprises an uninverted first signal and an inverted first signal and the second input signal comprises an uninverted second signal and an inverted second signal;

the transistor circuit comprises:
a first transistor having a control terminal connected to the first input to receive the uninverted first signal,
a second transistor having a control terminal connected to the first input to receive the inverted first signal, third and fourth transistors, the third transistor connected in series between the first transistor and the reference input to receive the uninverted reference signal and the fourth transistor connected in series with the first transistor and the reference input to receive the inverted reference signal, the third and fourth transistors having respective control terminals coupled to the second input for respectively receiving the uninverted and inverted second signals; and fifth and sixth transistors, the fifth transistor connected in series with the second transistor and the reference input to receive the uninverted reference signal and the sixth transistor connected in series between the second transistor and the reference input to receive the inverted reference signal, the fifth and sixth transistors having respective control terminals coupled to the second input for respectively receiving the inverted and uninverted second signals.

12. The programmable phase comparator of claim 11 further including another switch means connected between the second input and the transistor circuit.

13. The programmable phase comparator of claim 11 wherein output signal comprises an uninverted output signal and an inverted output signal.

14. The programmable phase comparator of claim 12 wherein the another switch means comprises a first pair of transistors connected as a differential pair and having bases connected to receive respective uninverted and inverted second signals, and a second pair of transistors connected as a differential pair and having respective emitter-collector circuits connected in series with respective emitter-collector circuits of the transistors of the first pair of transistors and in series with the current source, a junction between the emitter-collector circuits of one series connection of the another switch means being connected to the control terminals of the third and sixth transistors and a junction between the emitter-collector circuits of the other series connection of the another switch means being connected to the control terminals of the fourth and fifth transistors.

15. A programmable phase comparator comprising:

a switch circuit having a current source, impedance means, and a transistor circuit connected between the current source and the impedance means, the transistor circuit having first and second inputs for receiving respective first and second input signals having a phase difference, the first input signal including an uninverted first signal and an inverted first signal, and the second input signal including an uninverted second signal and inverted second signal;

a reference input connected between the transistor circuit and the impedance means for receiving a reference signal having a signal value selectable independently of the first and second input signals, the reference signal including an uninverted reference signal and an inverted reference signal; and an output connected to the reference input, the output providing an output signal having a component based on the signal value of the reference signal and representing the phase difference of the first and second input signals;

wherein the transistor circuit comprises:

a first transistor having a control terminal connected to the first input to receive the uninverted first signal, a second transistor having a control terminal connected to the first input to receive the inverted first signal, third and fourth transistors, the third transistor having a pair of terminals connected in series with the first transistor and the current source and the fourth transistor having a pair of terminals connected in series with the first transistor and the current source, the third and fourth transistors having respective control terminals coupled to the second input for respectively receiving the uninverted and inverted second signals, and fifth and sixth transistors, the fifth transistor having a pair of terminals connected in series with the second transistor and the current source and the sixth transistor having a pair of terminals connected in series with the second transistor and the current source, the fifth and sixth transistors having respective control terminals coupled to the second input for respectively receiving the inverted and uninverted second signals, the third and fifth transistors each having one terminal of its respective pair of terminals connected to the reference input to receive the uninverted reference signal and the fourth and sixth transistors each having one terminal of its respective pair of terminals connected to the reference input to receive the inverted reference signal.

16. The programmable phase comparator of claim 15 wherein the switch circuit comprises a Gilbert multiplier.

17. The programmable phase comparator of claim 15 wherein the output signal comprises an uninverted output signal and an inverted output signal.

18. The programmable phase comparator of claim 15 further including another switch circuit connected between the second input and the transistor circuit.

19. The programmable phase comparator of claim 18 wherein the other switch circuit comprises:

seventh and eighth transistors, the seventh transistor having a pair of terminals connected between the control terminal of the sixth transistor and the current source and the eighth transistor having a pair of terminals connected between the control terminal of the fifth transistor and the current source, the seventh and eighth transistors having respective control terminals coupled to the second input for respectively receiving the respective uninverted and inverted second signals; and ninth and tenth transistors, the ninth transistor having a pair of terminals connected between one of the pair of terminals of the seventh transistor and a supply terminal and the tenth transistor having a pair of terminals connected between one of the pair of terminals of the eighth transistor and the supply terminal.

20. A filter-tuning circuit comprising: an adjustable master filter for receiving a substantially-periodic input signal and outputting a substantially-periodic filtered signal based on an adjustable master cut-off frequency, an adjustable slave filter having an adjustable slave cut-off frequency, and a phase comparator for comparing the substantially-periodic input and filtered signals and outputting a phase signal for adjusting the cut-off frequencies of the master and slave filters based on a phase difference between the substantially-periodic input and filtered signals, the phase signal having a null condition representing a first predetermined phase difference, the phase comparator being characterized by an offset circuit responsive to a reference signal for having the null condition instead represent a second predetermined phase difference, the reference signal being selectable independent of the substantially-periodic input and filtered signals.

* * * * *

UNITED STATES PATENT AND TRADEMARK OFFICE
CERTIFICATE OF CORRECTION

PATENT NO.  : 5,635,863

DATED       : JUNE 3, 1997

INVENTOR(S) : JOHN J. PRICE JR.

It is certified that error appears in the above-indentified patent and that said Letters Patent is hereby corrected as shown below:

Col. 3, line 52, delete "$V_2N$", insert --$V_{2N}$--

Col. 8, line 33, delete "the other", insert --another--

Signed and Sealed this

Twenty-fifth Day of November, 1997

Attest:

BRUCE LEHMAN

*Attesting Officer*            *Commissioner of Patents and Trademarks*